US012666832B2

(12) United States Patent
    Kim et al.

(10) Patent No.:    US 12,666,832 B2
(45) Date of Patent:        Jun. 23, 2026

(54) DISPLAY DEVICE

(71) Applicant: Samsung Display Co., Ltd., Yongin-Si (KR)

(72) Inventors: Mi Na Kim, Suwon-si (KR); Seul Bee Lee, Suwon-si (KR); Kwang-Chul Jung, Seoul (KR); Yong Jun Jo, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 19/182,586

(22) Filed: Apr. 18, 2025

(65) Prior Publication Data

US 2025/0248255 A1      Jul. 31, 2025

Related U.S. Application Data

(63) Continuation of application No. 18/127,663, filed on Mar. 29, 2023, now Pat. No. 12,302,720, which is a continuation of application No. 17/220,853, filed on Apr. 1, 2021, now Pat. No. 11,621,314.

(30) Foreign Application Priority Data

Sep. 2, 2020    (KR) ........................ 10-2020-0111668

(51) Int. Cl.
     H10K 59/131          (2023.01)
(52) U.S. Cl.
     CPC .................................. H10K 59/131 (2023.02)
(58) Field of Classification Search
     None
     See application file for complete search history.

(56) References Cited

U.S. PATENT DOCUMENTS

| | | |
|---|---|---|
| 2013/0002632 A1 | 1/2013 | Choi |
| 2014/0124754 A1 | 5/2014 | Park et al. |
| 2016/0020432 A1 | 1/2016 | Yu |
| 2016/0064700 A1 | 3/2016 | Pyon et al. |
| 2016/0240603 A1 | 8/2016 | Park et al. |
| 2019/0148477 A1 | 5/2019 | Park et al. |
| 2020/0185489 A1 | 6/2020 | Jo et al. |
| 2020/0193917 A1 | 6/2020 | Park et al. |

(Continued)

FOREIGN PATENT DOCUMENTS

| | | |
|---|---|---|
| CN | 105895658 A | 8/2016 |
| CN | 110224011 A | 9/2019 |
| CN | 111293142 A | 6/2020 |

(Continued)

OTHER PUBLICATIONS

Chinese Office Action mailed Mar. 18, 2026, issued in related Chinese Application No. 202110755894.5, 8 pages.

*Primary Examiner* — Nicholas J Lee
(74) *Attorney, Agent, or Firm* — Innovation Counsel LLP

(57)                ABSTRACT

A display device includes: a substrate; a plurality of transistors disposed on the substrate; an initialization voltage line disposed on the substrate and including a first initialization voltage line that extends in a first direction, and a second initialization voltage line that extends in a second direction; and a driving voltage line disposed on the substrate and extending in the second direction, wherein each of the first initialization voltage line and the driving voltage line is connected to at least one of the plurality of transistors, and the second initialization voltage line and the driving voltage line overlap each other.

20 Claims, 13 Drawing Sheets

(56) References Cited

U.S. PATENT DOCUMENTS

2021/0399078 A1    12/2021   Um et al.

FOREIGN PATENT DOCUMENTS

| | | |
|---|---|---|
| CN | 210722408 U | 6/2020 |
| CN | 113823663 A | 12/2021 |
| KR | 10-2015-0040152 A | 4/2015 |
| KR | 10-2016-0100012 A | 8/2016 |
| KR | 10-1762344 B1 | 7/2017 |
| KR | 10-2019-0040160 A | 4/2019 |
| KR | 10-2084717 B1 | 3/2020 |
| KR | 10-2020-0037027 A | 4/2020 |
| KR | 10-2020-0071188 A | 6/2020 |

152

T4-1 T4-2

T3-1

151

T2

T3-2

T1

155a

T5

T6

153

T7

154

DR2

DR1

DISPLAY DEVICE

CROSS-REFERENCE TO RELATED APPLICATION

This application is a continuation application of U.S. patent application Ser. No. 18/127,663 filed on Mar. 29, 2023, which is a continuation application of U.S. patent application Ser. No. 17/220,853 filed on Apr. 1, 2021, now U.S. Pat. No. 11,621,314, which claims priority to and the benefit of Korean Patent Application No. 10-2020-0111668 filed in the Korean Intellectual Property Office on Sep. 2, 2020, the disclosure of which are incorporated herein by reference in their entireties.

BACKGROUND

(a) Field

The present disclosure relates to a display device, and more particularly, to a display device with an improved aperture ratio.

(b) Description of the Related Art

A display device is a device for displaying an image, and includes a liquid crystal display (LCD), an organic light emitting diode (OLED) display, and the like. The display device is implemented in various electronic devices such as a mobile phone, a navigation device, a digital camera, an electronic book, a portable game machine, and various terminals.

The display device may include a plurality of pixels arranged in a row direction and a column direction. Various circuit elements such as transistors and capacitors, and wires capable of supplying signals to these circuit elements may be disposed in each pixel.

The above information disclosed in this Background section is only for enhancement of understanding of the background of the present disclosure, and therefore it may contain information that may not form a prior art that is already known to a person of ordinary skill in the art.

SUMMARY

Embodiments of the present disclosure provide a display device having an improved aperture ratio.

According to an embodiment, a display device includes: a substrate; a plurality of transistors disposed on the substrate; an initialization voltage line disposed on the substrate and including a first initialization voltage line that extends in a first direction, and a second initialization voltage line that extends in a second direction; and a driving voltage line disposed on the substrate and extending in the second direction, wherein each of the first initialization voltage line and the driving voltage line is connected to at least one of the plurality of transistors, and the second initialization voltage line and the driving voltage line overlap each other.

The first initialization voltage line and the second initialization voltage line may be disposed in different layers.

The first initialization voltage line, the driving voltage line, and the second initialization voltage line may be sequentially stacked on the substrate.

The second initialization voltage line may be disposed for every n pixels in the first direction, and n is a natural number of 1 or greater.

The second initialization voltage line may be disposed for every two pixels in the first direction.

The display device may further include a connecting member disposed in a same layer as the driving voltage line, and the connecting member may electrically connect the second initialization voltage line and the first initialization voltage line.

The second initialization voltage line may include an extension protruding in the first direction, and the extension may overlap the connecting member.

The display device may further include a first conductive layer, a second conductive layer, a third conductive layer, and a fourth conductive layer that are sequentially stacked on the substrate.

The first initialization voltage line, the second initialization voltage line, and the driving voltage line may be disposed on different conductive layers.

The first initialization voltage line may be disposed on the second conductive layer, the driving voltage line and the connecting member may be disposed on the third conductive layer, and the second initialization voltage line may be disposed on the fourth conductive layer.

According to another embodiment, a display device includes: a substrate; a plurality of transistors disposed on the substrate; an initialization voltage line disposed on the substrate; and a driving voltage line disposed on the substrate, wherein each of the first initialization voltage line and the driving voltage line is connected to at least one of the plurality of transistors, and the initialization voltage line and the driving voltage line extend in a same direction and overlap each other.

The initialization voltage line may include a first initialization voltage line and a second initialization voltage line, the second initialization voltage line may extend in a same direction as the driving voltage line, and the first initialization voltage line and the second initialization voltage line may be disposed in different layers and are electrically connected to each other.

The first initialization voltage line, the driving voltage line, and the second initialization voltage line may be sequentially stacked on the substrate.

The first initialization voltage line may extend in a first direction and the second initialization voltage line may extend in a second direction. The second initialization voltage line may be disposed for every n pixels in the first direction, and n is a natural number of 1 or greater.

The display device may further include a connecting member disposed in a same layer as the driving voltage line, and the connecting member may electrically connect the second initialization voltage line and the first initialization voltage line.

The second initialization voltage line may include an extension protruding in a first direction, the connecting member may overlap the extension, and the connecting member and the extension may be electrically connected to each other.

The display device may further include a first conductive layer, a second conductive layer, a third conductive layer, and a fourth conductive layer that are sequentially stacked on the substrate.

The first initialization voltage line may be disposed on the second conductive layer, the driving voltage line and the connecting member may be disposed on the third conductive layer, and the second initialization voltage line may be disposed on the fourth conductive layer.

The first initialization voltage line may extend in the first direction and the second initialization voltage line may extend in a second direction, the second initialization voltage line may be disposed for every at least two pixels in the first direction, and the at least two pixels may include a first pixel that includes the second initialization voltage line and a second pixel that does not include the second initialization voltage line.

The connecting member may include a first connecting member and a second connecting member, the first connecting member may overlap the first pixel and may include a connection extension overlapping the extension, and the connecting member may overlap the second pixel and may not include a connection extension.

According to the embodiments, the display device having an improved aperture ratio may be provided.

DETAILED DESCRIPTION OF THE EMBODIMENTS

Figure 1:
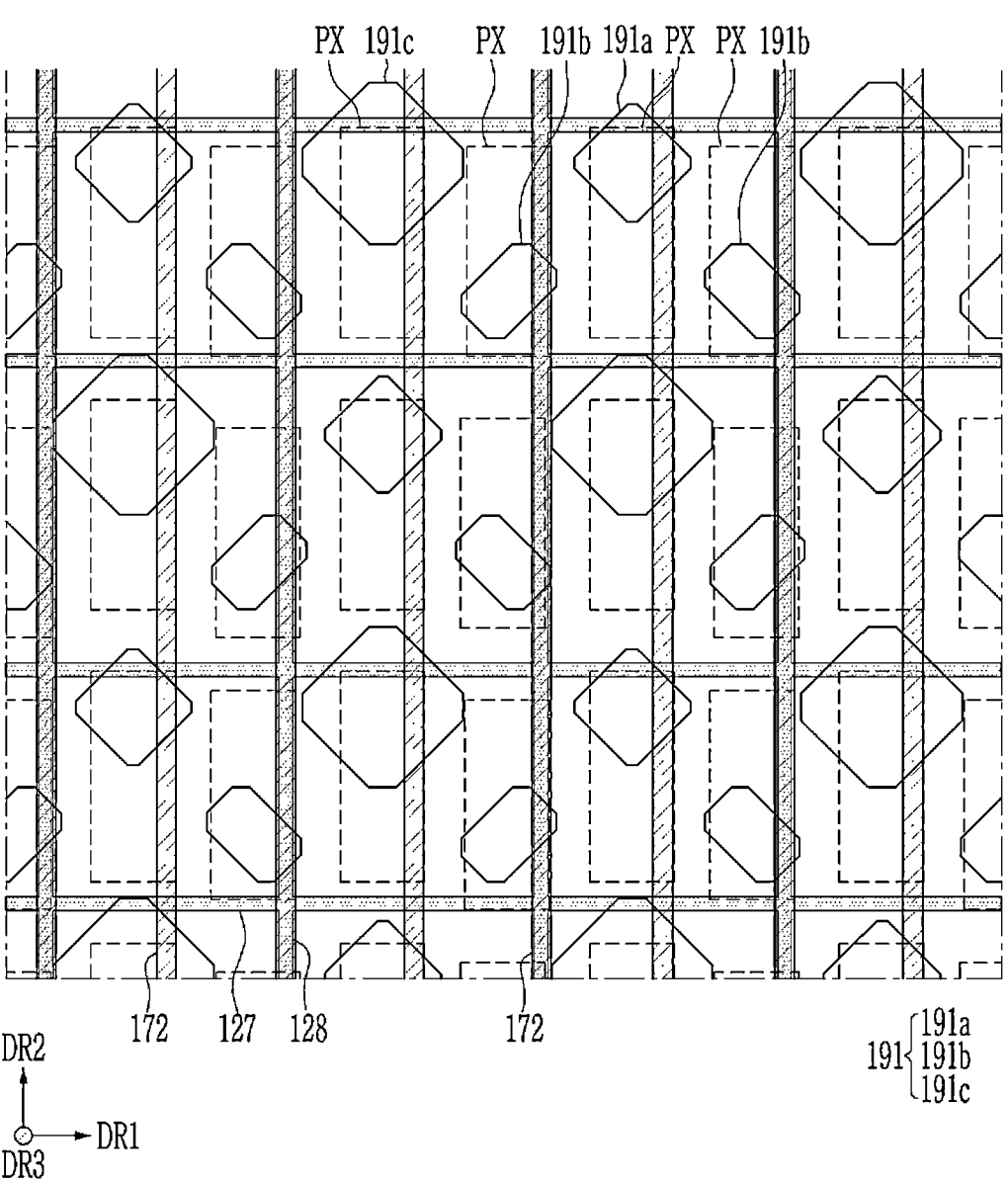
FIG. 1 illustrates a schematic top plan view of an area of a portion of a display device according to an embodiment.

The present disclosure will be described more fully hereinafter with reference to the accompanying drawings, in which embodiments of the present disclosure are shown. As those skilled in the art would realize, the described embodiments may be modified in various different ways, without departing from the spirit or scope of the present disclosure.

In order to clearly describe the present disclosure, parts that are irrelevant to the description may be omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In other words, the thicknesses of layers, films, panels, regions, areas etc., may be exaggerated for clarity in the drawings.

It will be understood that when an element such as a layer, film, region, or substrate is referred to as being "on" another element, it can be directly on the other element or one or more intervening elements may also be present therebetween. In contrast, when an element is referred to as being "directly on" another element, there may be no intervening elements present therebetween. Further, in the specification, the word "on" or "above" means positioned on or below an object, and does not necessarily mean positioned on the upper side of the object based on a gravitational direction.

In addition, unless explicitly described to a first contrary, the word "comprise" and its variations such as "comprises" or "comprising" will be understood to imply an inclusion of stated elements but not an exclusion of any other elements.

Further, throughout the specification, the phrase "in a plan view" or "on a plane" means viewing a target from the top, and the phrase "in a cross-sectional view" or "on a cross-section" means viewing a cross-section formed by vertically cutting a target from a side.

FIG. 1 illustrates a schematic top plan view of an area of a portion of a display device according to an embodiment.

Referring to FIG. 1, the display device includes a first initialization voltage line 127, a second initialization voltage line 128, a driving voltage line 172, and a pixel electrode 191. The pixel electrode 191 includes a first pixel electrode 191a, a second pixel electrode 191b, and a third pixel electrode 191c. An area overlapping the first pixel electrode 191a may emit light of a first color, an area overlapping a second pixel electrode 191b may emit light of a second color, and an area overlapping the third pixel electrode 191c may emit light of a third color, but the present disclosure is not limited thereto.

Figure 2:
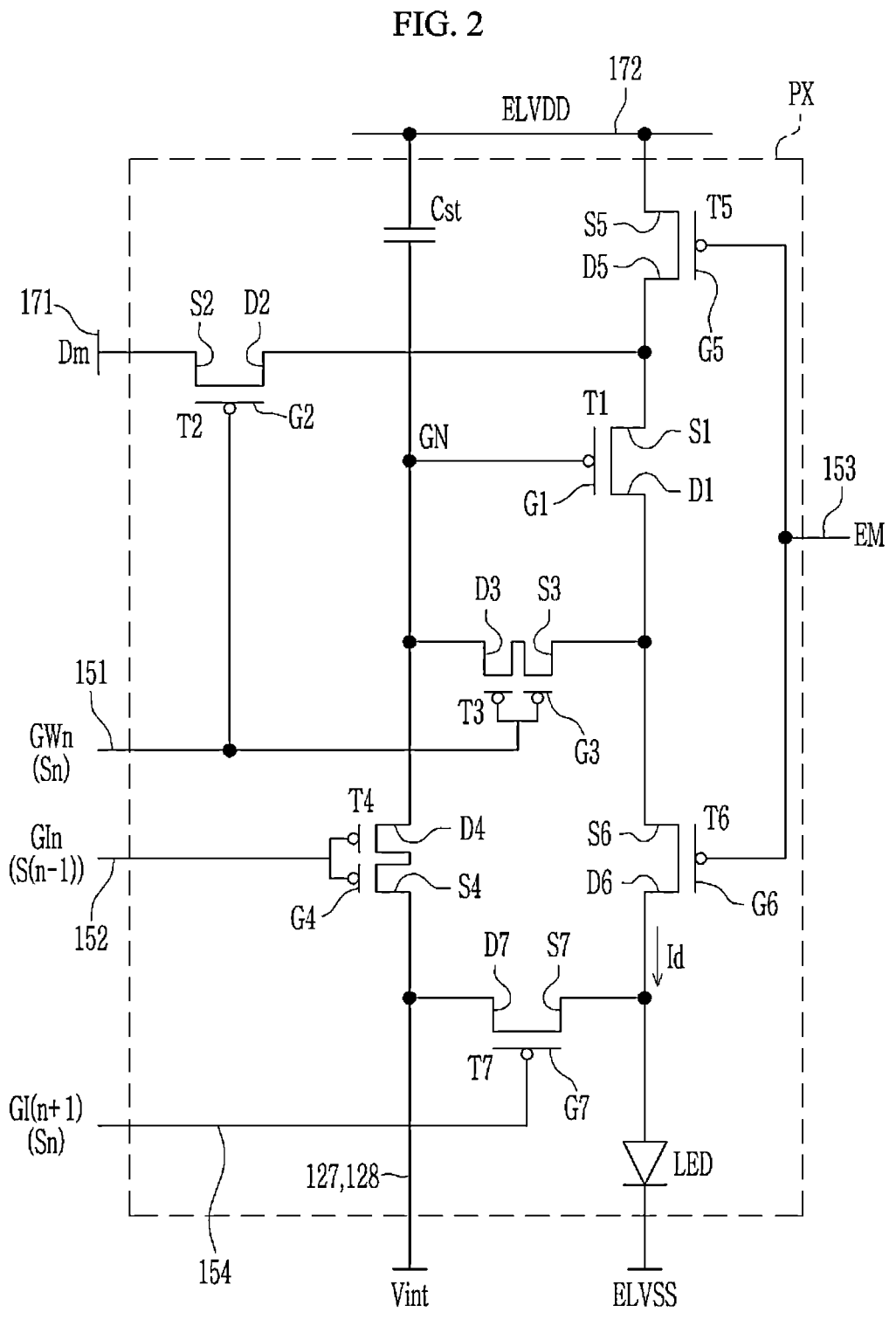
FIG. 2 illustrates a circuit diagram of a pixel according to an embodiment.

A pixel PX may include a plurality of transistors T1, T2, T3, T4, T5, T6, and T7 connected to several signal lines, a storage capacitor Cst, and a light emitting diode LED, which will be described later in FIG. 2. Hereinafter, in the present specification, an area corresponding to a pixel PX refers to an area indicated by a dotted line as shown in FIG. 2. Referring to FIG. 1, the pixel electrode 191 may correspond to the pixel PX.

Referring to FIG. 1, the first initialization voltage line 127 may extend along a first direction DR1, and the second initialization voltage line 128 may extend along a second direction DR2 that crosses the first direction DR1. The first initialization voltage line 127 and the second initialization voltage line 128 may have a mesh structure in a plan view. It is noted that FIG. 1 does not specifically illustrate a structure in which the first initialization voltage line 127 and the second initialization voltage line 128 are connected to each pixel PX, but it is understood that they are connected to an adjacent pixel PX.

According to an embodiment, the first initialization voltage line 127 and the second initialization voltage line 128 that are disposed in a mesh shape may prevent a pinkish display image that may occur due to a load difference of the second initialization voltage line 128 for each area.

The first initialization voltage line 127 and the second initialization voltage line 128 may be disposed in different layers or on the same layer. In a case where the first initialization voltage line 127 and the second initialization voltage line 128 are disposed in different layers, they may be connected to each other through a contact hole and/or a connecting member. The first initialization voltage line 127 and the second initialization voltage line 128 may receive the same initialization voltage.

The driving voltage line 172 may substantially extend along the second direction DR2. The driving voltage line 172 and the second initialization voltage line 128 may extend parallelly along the same direction. The driving voltage line 172 may receive a driving voltage.

According to an embodiment, the second initialization voltage line 128 and the driving voltage line 172 may be disposed on different layers, and the second initialization voltage line 128 may overlap the driving voltage line 172. The second initialization voltage line 128 and the driving voltage line 172 extending along the second direction DR2 and overlapping each other in a third direction DR3 may increase an aperture ratio of the pixel PX.

The second initialization voltage line 128 may be disposed one for every n pixels PX disposed in the first direction DR1. Here, n is a natural number of 1 or greater.

FIG. 1 shows an embodiment in which the second initialization voltage line 128 is disposed one for every two adjacent pixels PX along the first direction DR1. Since the second initialization voltage line 128 is disposed for every two pixels PX, the second initialization voltage line 128 may overlap every two driving voltage lines 172.

In the display device according to an embodiment, red (R)/green(G)/blue(B)/green(G) pixels may be alternately disposed along the first direction DR1. In the present embodiment of FIG. 1 in which the second initialization voltage line 128 is disposed for every two pixels PX, it may repeatedly overlap pixels displaying the same color. For example, the second initialization voltage line 128 may overlap the pixels PX emitting light of the same color (e.g., the pixels PX corresponding to the second pixel electrode 191*b*), but the present disclosure is not limited thereto.

Hereinafter, a specific structure of the display device according to various embodiments of the present disclosure will be described in detail with reference to the accompanying drawings. However, these are merely examples, and the structure of the present disclosure is not limited thereto.

FIG. 2 illustrates a circuit diagram of the pixel PX according to an embodiment. For reference, the pixel PX described herein may include a driving circuit and a light emitting diode connected to the driving circuit, and the driving circuit may include a plurality of transistors including an active layer and a conductor.

Referring to FIG. 2, the display device includes a plurality of pixels PX and a plurality of signal lines. The pixel PX may include a plurality of transistors including a first transistor T1, a second transistor T2, a third transistor T3, a fourth transistor T4, a fifth transistor T5, a sixth transistor T6, and a seventh transistor T7 that are connected to the plurality of signal lines. The plurality of signal lines may include the first initialization voltage line 127, the second initialization voltage line 128, a first scan line 151, a second scan line 152, a control line 153, a third scan line 154, a data line 171, and the driving voltage line 172, a capacitor Cst, and at least one light emitting diode LED. In the present embodiment, the pixel PX includes one light emitting diode LED.

The first and second initialization voltage lines 127 and 128 may transmit an initialization voltage Vint. The first, second, and third scan lines 151, 152, and 154 may respectively transmit scan signals GWn, GIn, and GI(n+1). The scan signals GWn, GIn, and GI(n+1) may transmit a gate-on voltage and a gate-off voltage to turn-on/turn-off the transistors T2, T3, T4, and T7, respectively.

The first scan line 151 may transmit the scan signal GWn, the second scan line 152 may transmit the scan signal GIn having a gate-on voltage at different timing from that of the first scan line 151, and the third scan line 154 may transmit a scan signal GI(n+1). In the present embodiment, an example in which the second scan line 152 transmits a gate-on voltage with a timing prior to the first scan line 151 will be mainly described. For example, among the scan signals applied during one frame, the scan signal GWn may be an n-th scan signal Sn (n is a natural number of 1 or greater), the scan signal GIn may be a previous scan signal or an (n−1)-th scan signal, and the scan signal GI(n+1) may be the n-th scan signal Sn. However, the present disclosure is not limited thereto, and the scan signal GI(n+1) may be a scan signal that is different from the n-th scan signal Sn.

The control line 153 may transmit a control signal, for example, a light emission control signal EM, that is capable of controlling light emission of the light emitting diode LED. The light emission control signal EM transmitted by the control line 153 may transmit a gate-on voltage and a gate-off voltage, and may have a different waveform from that of a scan signal transmitted by the first, second, and third scan lines 151, 152, and 154.

The data line 171 may transmit a data signal Dm, and the driving voltage line 172 may transmit a driving voltage ELVDD. The data signal Dm may have a voltage level corresponding to an image signal inputted to the display device, and the driving voltage ELVDD may have a substantially constant voltage level.

Although not shown, the display device may further include a driver that transmits various signals to the plurality of signal lines.

The first scan line 151 may transmit the scan signal GWn to the second transistor T2 and the third transistor T3, the second scan line 152 may transmit the scan signal GIn to the fourth transistor T4, and the third scan line 154 may transmit the scan signal GI(n+1) to the seventh transistor T7, while the control line 153 may transmit the light emission control signal EM to the fifth transistor T5 and the sixth transistor T6.

A gate electrode G1 of the first transistor T1 is connected to a first end of the capacitor Cst through a driving gate node GN, a first electrode S1 of the first transistor T1 is connected to the driving voltage line 172 via the fifth transistor T5, and a second electrode D1 of the first transistor T1 is connected to an anode of the light emitting diode LED via the sixth transistor T6. The first transistor T1 may receive the data signal Dm transmitted by the data line 171 according to a switching operation of the second transistor T2 to supply a driving current Id to the light emitting diode LED.

A gate electrode G2 of the second transistor T2 is connected to the first scan line 151, a first electrode S2 of the second transistor T2 is connected to the data line 171, and a second electrode D2 of the second transistor T2 is connected to the first electrode S1 of the first transistor T1. The second transistor T2 may be turned on according to the scan signal GWn transmitted through the first scan line 151 and transmit the data signal Dm transmitted from the data line 171 to the first electrode S1 of the first transistor T1.

A gate electrode G3 of the third transistor T3 is connected to the first scan line 151, and a first electrode S3 of the third transistor T3 is connected to the second electrode D1 of the first transistor T1. A second electrode D3 of the third transistor T3 is connected to the first end of the capacitor Cst and the gate electrode G1 of the first transistor T1. The third transistor T3 may be turned on according to the scan signal GWn transmitted through the first scan line 151 and diode-connect the first transistor T1 by connecting the gate electrode G1 and the second electrode D1 of the first transistor T1.

A gate electrode G4 of the fourth transistor T4 is connected to the second scan line 152, a first electrode S4 of the fourth transistor T4 is connected to a terminal of the initialization voltage Vint, and a second electrode D4 of the fourth transistor T4 is connected to the first end of the capacitor Cst and the gate electrode G1 of the first transistor T1. The fourth transistor T4 may be turned on according to the scan signal GIn transmitted through the second scan line 152 and transmit the initialization voltage Vint to the gate electrode G1 of the first transistor T1 to perform an initializing operation for initializing a voltage of the gate electrode G1 of the first transistor T1.

A gate electrode G5 of the fifth transistor T5 is connected to the control line 153, a first electrode S5 of the fifth transistor T5 is connected to the driving voltage line 172, and a second electrode D5 of the fifth transistor T5 is connected to the first electrode S1 of the first transistor T1 and the second electrode D2 of the second transistor T2.

A gate electrode G6 of the sixth transistor T6 is connected to the control line 153, a first electrode S6 of the sixth transistor T6 is connected to the second electrode D1 of the first transistor T1 and the first electrode S3 of the third transistor T3, and a second electrode D6 of the sixth transistor T6 is electrically connected to the anode of the light emitting diode LED. The fifth transistor T5 and the sixth transistor T6 may be simultaneously turned on according to the light emission control signal EM transmitted through the control line 153.

A gate electrode G7 of the seventh transistor T7 is connected to the third scan line 154, a first electrode S7 of the seventh transistor T7 is connected to the second electrode D6 of the sixth transistor T6 and the anode of the light emitting diode LED, and a second electrode D7 of the seventh transistor T7 is connected to the terminal of the initialization voltage Vint and the first electrode S4 of the fourth transistor T4.

The transistors T1, T2, T3, T4, T5, T6, and T7 may be P-type channel transistors such as a P-channel metal-oxide-semiconductor (PMOS), but are not limited thereto. In some embodiments, the transistors T1, T2, T3, T4, T5, T6, and T7 may be an N-type channel transistor, or may include at least one P-type channel transistor and at least one N-type channel transistor.

As described above, the first end of the capacitor Cst is connected to the gate electrode G1 of the first transistor T1, and a second end of the capacitor Cst is connected to the driving voltage line 172. The cathode of the light emitting diode LED may be connected to a common voltage terminal that transmits a common voltage ELVSS.

The circuit structure of the pixel PX according to an embodiment is not limited to the example shown in FIG. 2, and the number of transistors and capacitors included in the pixel PX and their connection relationships may be variously changed without deviating from the scope of the present disclosure.

Figure 3:
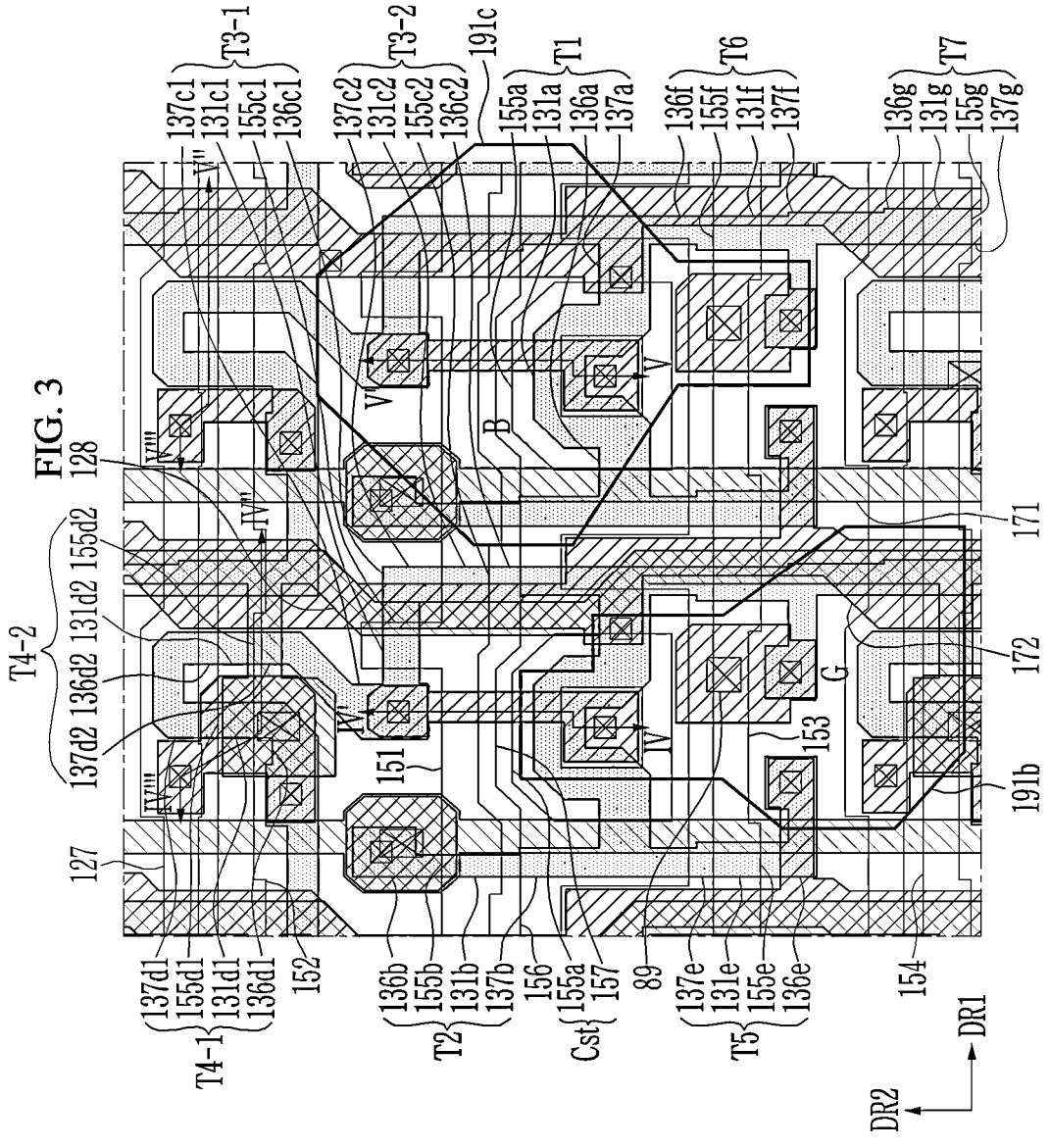
FIG. 3 illustrates a top plan view of two adjacent pixels according to an embodiment.
Figure 4:
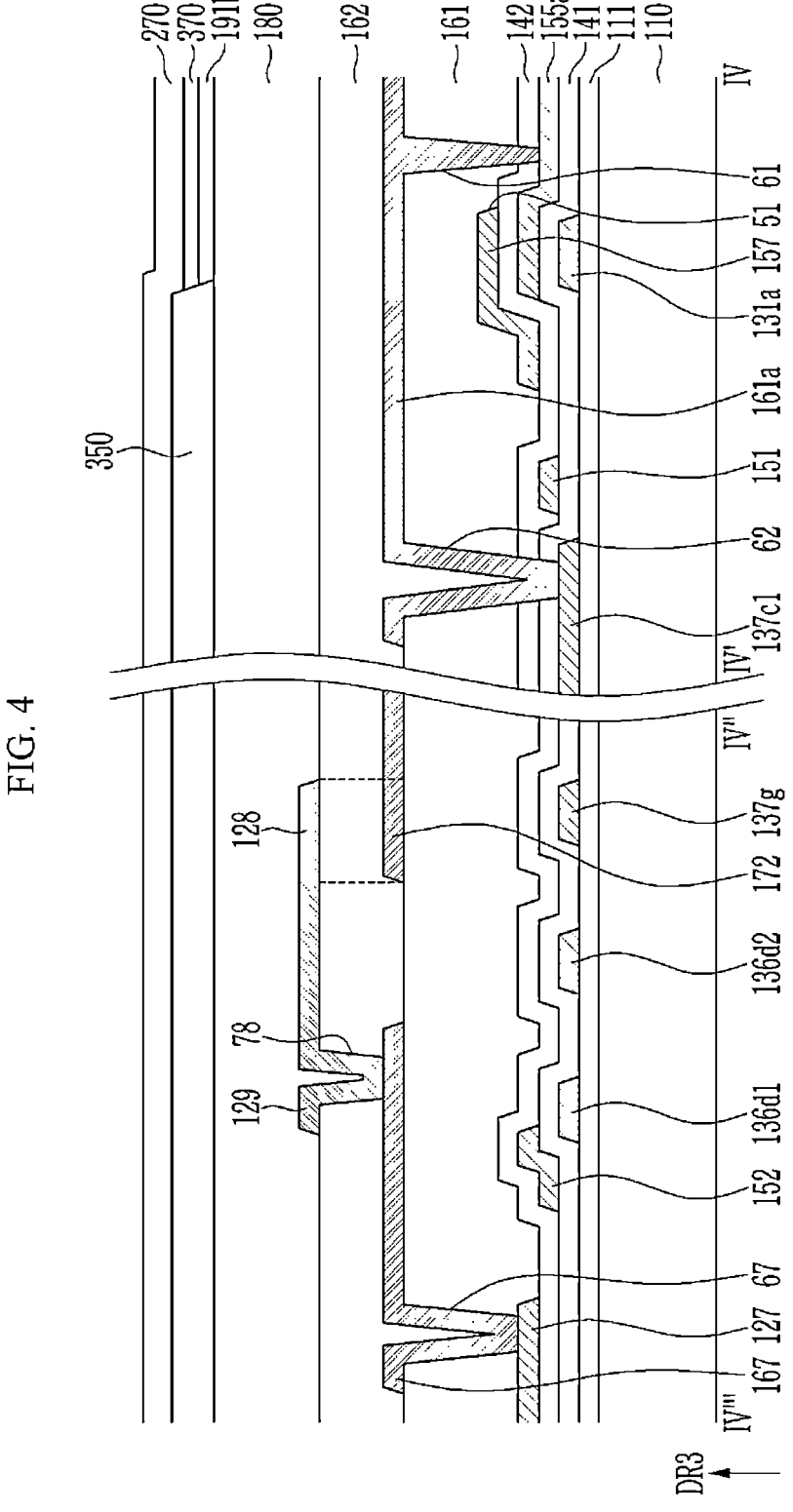
FIG. 4 illustrates a cross-sectional view taken along line IV-IV' and line IV"-IV"' of FIG. 3.
Figure 5:
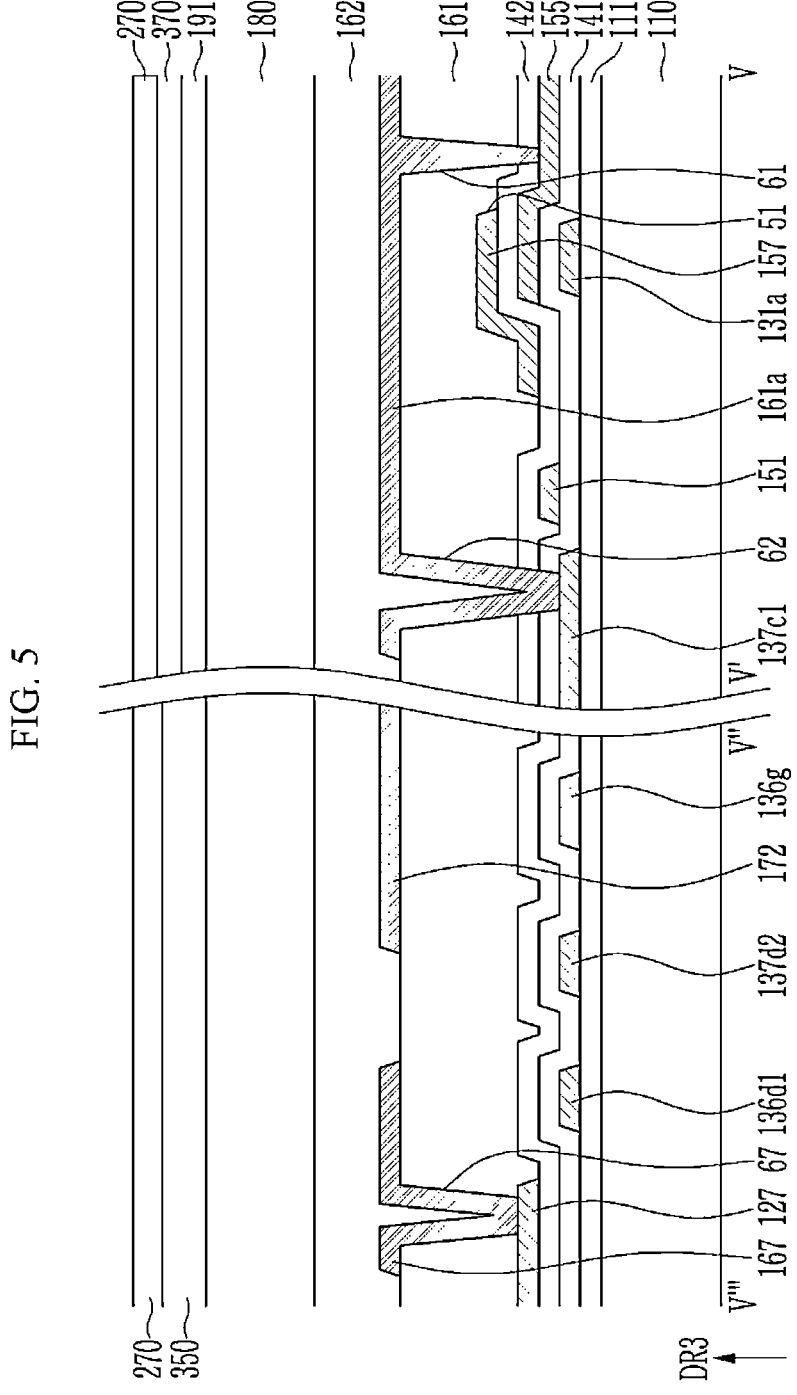
FIG. 5 illustrates a cross-sectional view taken along line V-V' and line V"-V"' of FIG. 3.

Hereinafter, a detailed structure of a display device according to an embodiment will be described with reference to FIG. 3 to FIG. 10 with reference to FIG. 1 and FIG. 2 described above. FIG. 3 illustrates a top plan view of two adjacent pixels PX according to an embodiment; FIG. 4 illustrates a cross-sectional view taken along line IV-IV' and line IV"-IV"' of FIG. 3; FIG. 5 illustrates a cross-sectional view taken along line V-V' and line V"-V"' of FIG. 3; and FIG. 6, FIG. 7, FIG. 8, FIG. 9, and FIG. 10 respectively illustrate a top plan view of two adjacent pixels PX. For convenience of understanding, a planar structure of the display device according to an embodiment will be mainly described, and then a cross-sectional structure thereof will be described.

Referring to the top plan views of FIG. 3 and FIG. 6 to FIG. 10, the pixel PX of the display device may include the plurality of transistors T1, T2, T3, T4, T5, T6, and T7 connected to the first, second, and third scan lines 151, 152, and 154, the control line 153, the data line 171, and the driving voltage line 172, and the capacitor Cst. The pixel PX shown in FIG. 3 may be repeatedly disposed in a horizontal direction along the first direction DR1 and a vertical direction along the second direction DR2.

The first, second, and third scan lines 151, 152, and 154 and the control line 153 may substantially extend in the same direction (e.g., the first direction DR1) in a plan view. The first scan line 151 may be disposed between the second scan line 152 and the control line 153 in the plan view.

The data line 171 and the driving voltage line 172 may substantially extend in the second direction DR2 in the plan view, and may cross the first, second, and third scan lines 151, 152, and 154 and the control line 153. The data line 171 may transmit the data signal Dm, and the driving voltage line 172 may transmit the driving voltage ELVDD. The data line 171 and the driving voltage line 172 may be disposed in the same layer or different layers.

The display device may further include a storage line 156 and the first and second initialization voltage lines 127 and 128.

The storage line 156 may extend in the first direction DR1 that is a substantially horizontal direction in the plan view. The storage line 156 may be disposed between the first scan line 151 and the control line 153 in the plan view. The storage line 156 may include an extension 157 corresponding to each pixel PX. The storage line 156 may transmit the driving voltage ELVDD. The extension 157 may include an opening 51 that is substantially disposed in a center of the extension 157.

The first initialization voltage line 127 may transmit the initialization voltage Vint while substantially extending in the first direction DR1, and most of the first initialization voltage line 127 may be disposed between adjacent storage lines 156 in the second direction DR2. As shown in FIG. 3, the first initialization voltage line 127 may be disposed adjacent to the fourth transistor T4.

The second initialization voltage line 128 may transmit the initialization voltage Vint while substantially extending in the second direction DR2. One second initialization voltage line 128 may be disposed for every two pixels PX, but the present disclosure is not limited thereto.

Figure 9:
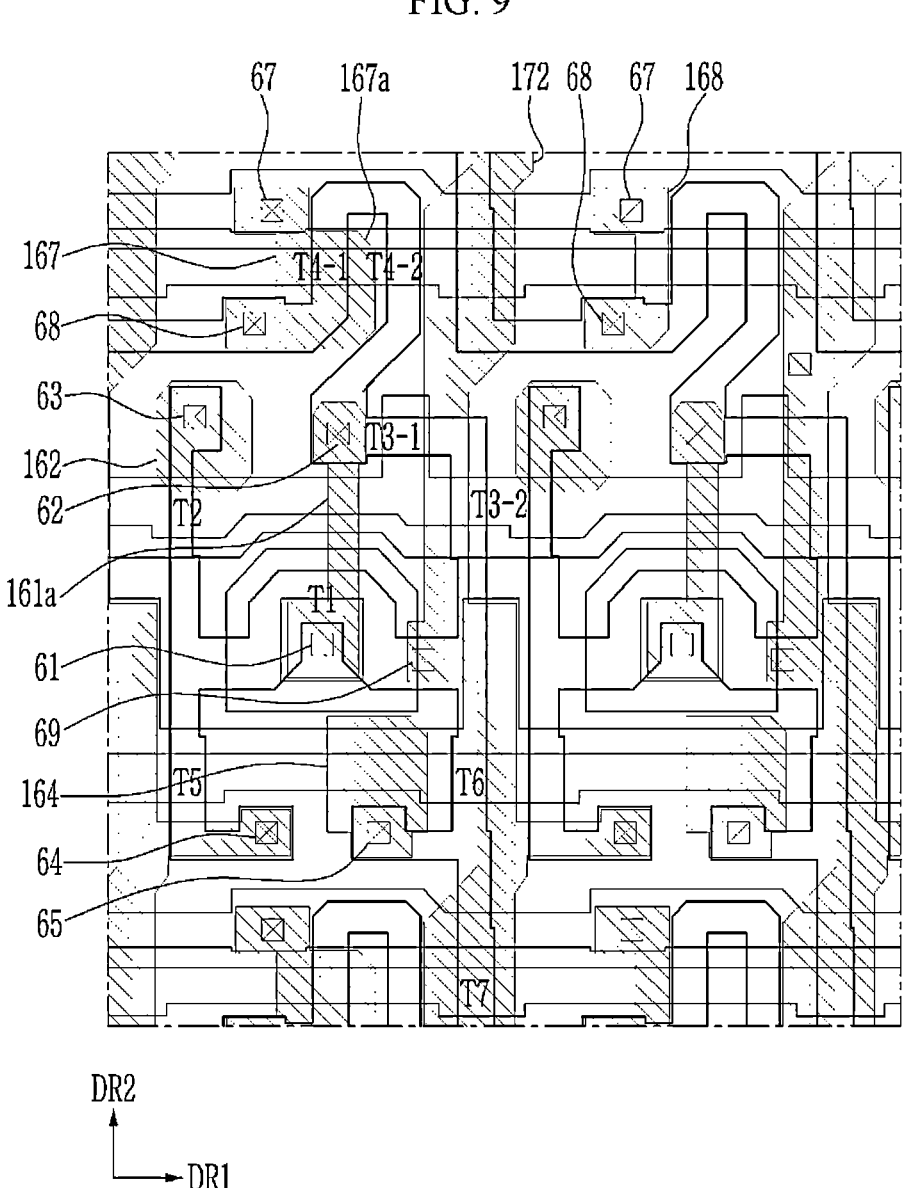
Figure 10:
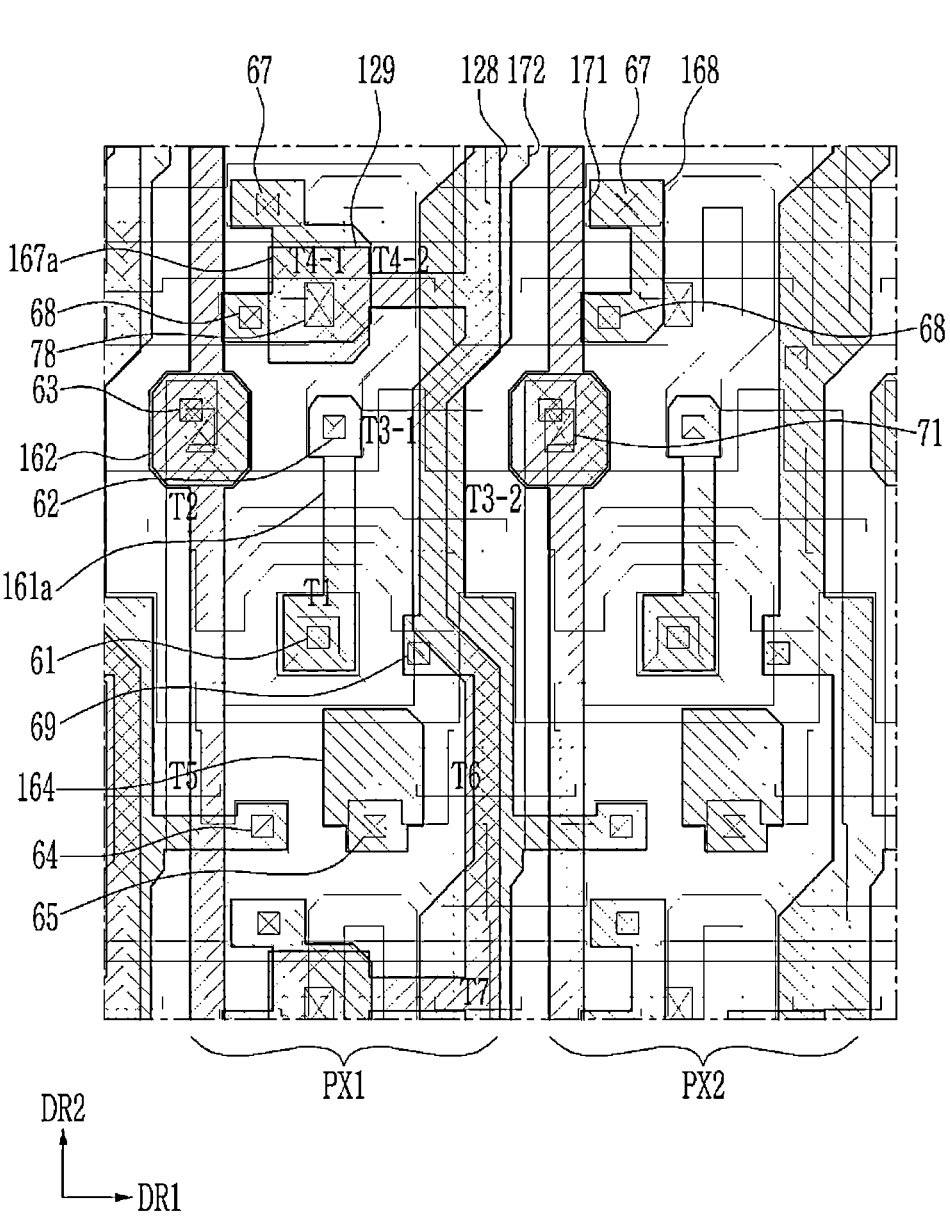

The first initialization voltage line 127 and the second initialization voltage line 128 may have a mesh structure in the plan view. As shown in FIG. 9 and FIG. 10, the first initialization voltage line 127 and the second initialization voltage line 128 may be electrically connected to each other through contact holes 67 and 78, and they will be described in more detail in a cross-sectional structure below.

According to an embodiment, the second initialization voltage line 128 may overlap the driving voltage line 172. The second initialization voltage line 128 and the driving voltage line 172 extending along the second direction DR2 and overlapping each other may increase an aperture ratio of the pixel PX.

Figure 7:
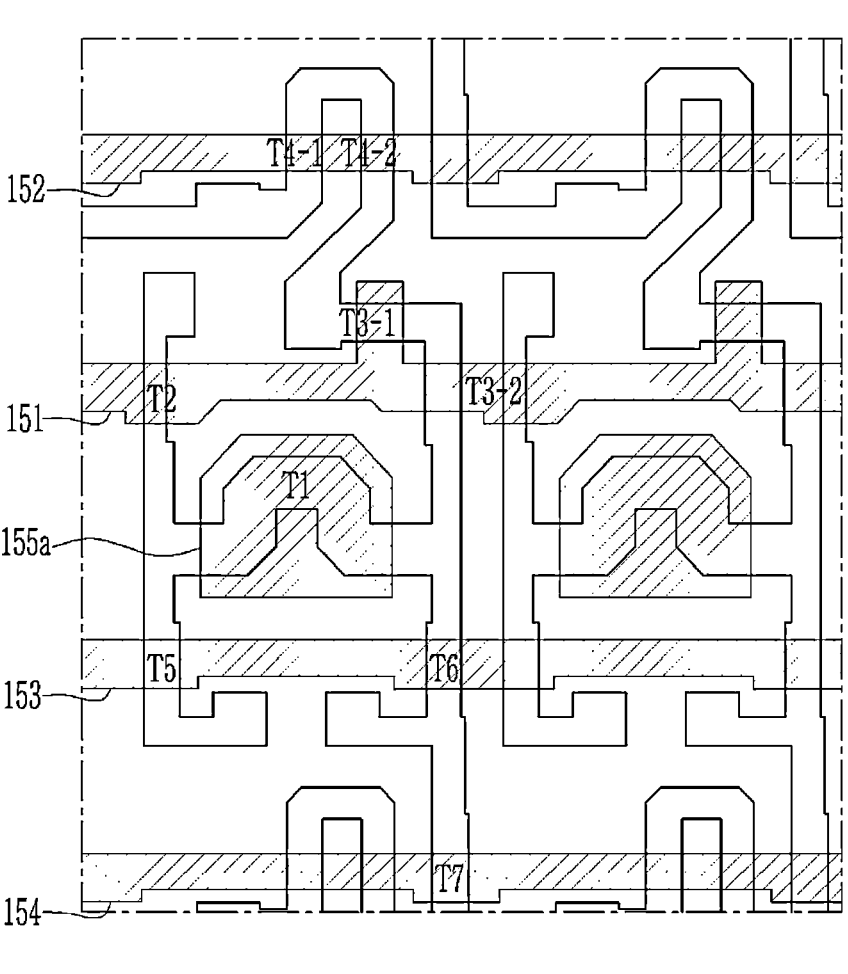
Figure 7:

Referring to FIG. 3 and FIG. 7, the first, second, and third scan lines 151, 152, and 154, the control line 153, and a driving gate electrode 155a of the first transistor T1 may be included in a first conductive layer The first conductive layer may be disposed on the same layer in a cross-sectional view, and may include the same material.

Figure 8:
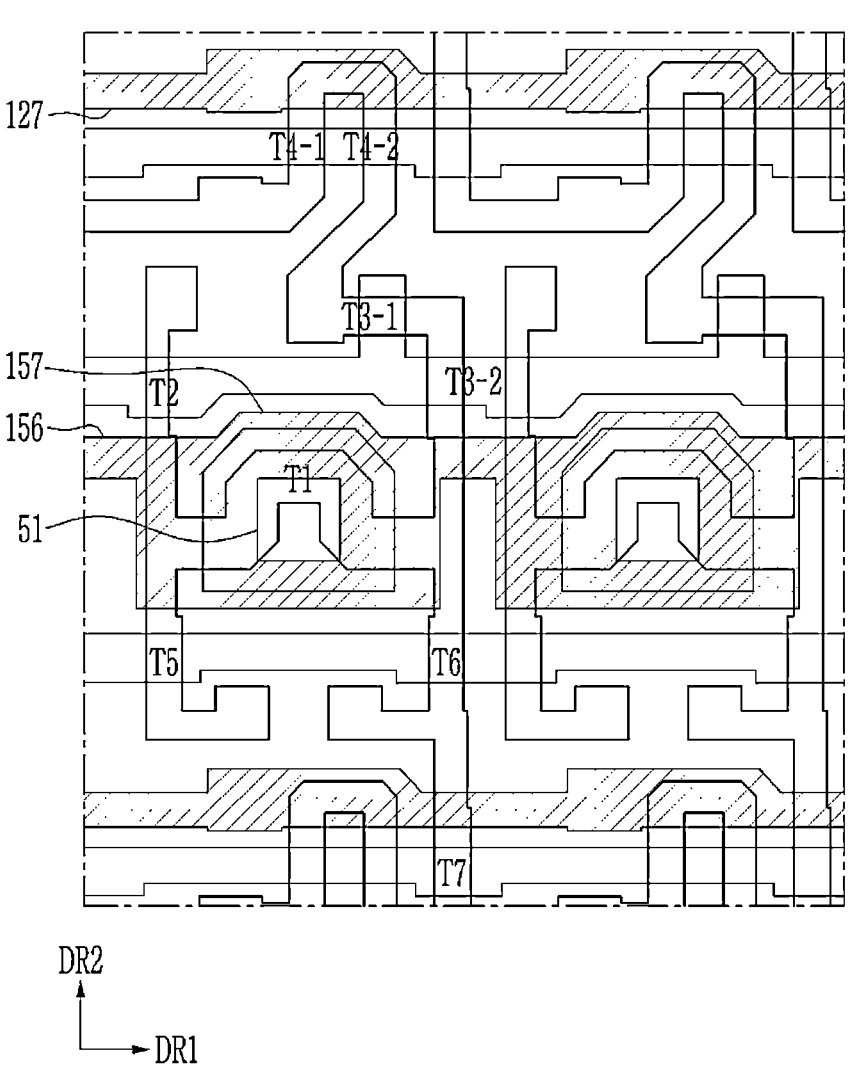

Referring to FIG. 3 and FIG. 8, the storage line 156 and the extension 157 and the first initialization voltage line 127 may be included in a second conductive layer. The second conductive layer may be different from the first conductive layer that includes the first scan line 151, the second scan line 152, the control line 153, the third scan line 154, and the driving gate electrode 155a. The second conductive layer may be disposed on the same layer in a cross-sectional view, and may include the same material. The second conductive layers may be disposed on a layer above the first conductive layer.

Referring to FIG. 3 and FIG. 9, the driving voltage line 172 and connecting members that include a first connecting member 161a, a second connecting member 162, a third connecting member 164, and fourth connecting members 167 and 168 may be included in a third conductive layer. The third conductive layer may be different from the first and second conductive layers. The third conductive layer may be disposed on the same layer in a cross-sectional view, and may include the same material. The third conductive layer may be disposed on a layer above the second conductive layer.

Referring to FIG. 3 and FIG. 10, the data line 171 and the second initialization voltage line 128 and an extension 129 may be included in a fourth conductive layer. The fourth conductive layer may be different from the first to third conductive layers. The fourth conductive layer may be disposed on the same layer in a cross-sectional view, and may include the same material. The fourth conductive layer may be disposed on a layer above the third conductive layer.

In this way, the first initialization voltage line 127 and the second initialization voltage line 128 may be disposed in different layers to increase design freedom. In addition, the second initialization voltage line 128 overlapping the driving voltage line 172 may increase the aperture ratio of the pixel PX.

Figure 6:
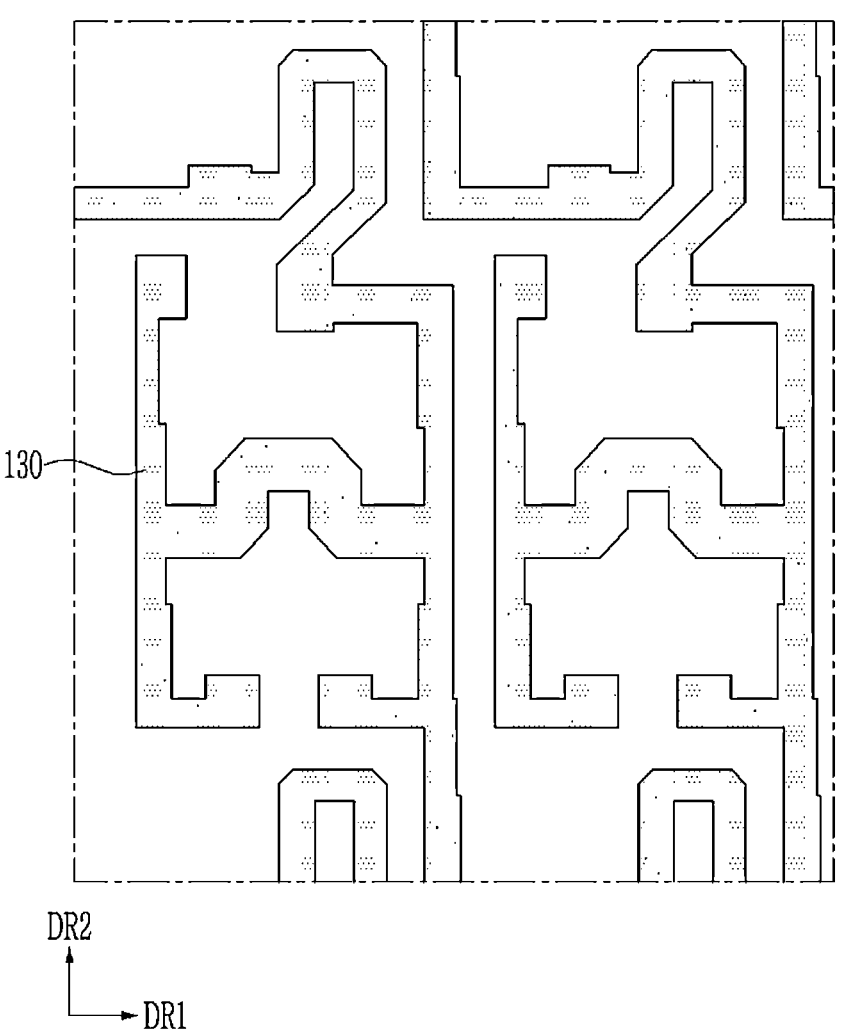
FIG. 6, FIG. 7, FIG. 8, FIG. 9, and FIG. 10 respectively illustrate a top plan view of two adjacent pixels.

Referring to FIG. 6, a channel of each of the plurality of transistors T1, T2, T3, T4, T5, T6, and T7 may be formed inside an active layer 130. The active layer 130 is not limited to the shape shown in FIG. 6, and it may be curved in various shapes. The active layer 130 may be made of a semiconductor material such as amorphous/polysilicon or an oxide semiconductor.

Referring to FIG. 3 and FIG. 4, the active layer 130 includes a plurality of channel regions that are semiconductors, and a plurality of conductive regions. The channel regions includes channel regions 131a, 131b, 131c1, 131c2, 131d1, 131d2, 131e, 131f, and 131g respectively corresponding to channels of the transistors T1, T2, T3, T4, T5, T6, and T7. The remaining portion of the active layer 130 excluding the channel regions 131a, 131b, 131c1, 131c2, 131d1, 131d2, 131e, 131f, and 131g may correspond to a conductive region. The conductive region has a carrier concentration higher than that of the channel regions 131a, 131b, 131c1, 131c2, 131d1, 131d2, 131e, 131f, and 131g. A pair of conductive regions disposed at respective sides of the channel regions 131a, 131b, 131c1, 131c2, 131d1, 131d2, 131e, 131f, and 131g may correspond to first and second electrodes of the corresponding transistors T1, T2, T3, T4, T5, T6, and T7.

The first transistor T1 includes a channel region 131a, a first electrode 136a and a second electrode 137a that are disposed at respective sides of the channel region 131a, and the driving gate electrode 155a that overlaps the channel region 131a in a plan view.

The channel region 131a may have a bending portion. For example, the channel region 131a may have a meandering shape or a zigzag shape. FIG. 3 and FIG. 6 illustrate an example in which the channel region 131a includes a U-shaped that is substantially inverted vertically.

The driving gate electrode 155a may be included in the first conductive layer that includes the first scan line 151, the second scan line 152, the control line 153, the third scan line 154, and the driving gate electrode 155a described above, and may be connected to the first connecting member 161a through a contact hole 61 as shown in FIG. 10. The contact hole 61 may be disposed in the opening 51 of the extension 157 of the storage line 156. The first connecting member 161a may substantially extend in the second direction DR2, and may cross the first scan line 151. The first connecting member 161a and/or the driving gate electrode 155a may correspond to the driving gate node GN shown in the circuit diagram of FIG. 2.

The second transistor T2 includes a channel region 131b, a first electrode 136b, and a second electrode 137b that are disposed at respective sides of the channel region 131b, and a gate electrode 155b that overlaps the channel region 131b in a plan view. The gate electrode 155b may correspond to a portion of the first scan line 151. The first electrode 136b is connected to the second connecting member 162 through a contact hole 63, and the second electrode 137b is connected to the first electrode 136a of the first transistor T1.

As shown in FIG. 10, the second connecting member 162 is connected to the data line 171 through a contact hole 71, and the first electrode 136b may be electrically connected to the data line 171 to receive the data signal Dm.

The third transistor T3 may be formed in two portions to prevent a leakage current. In the present embodiment, the third transistor T3 may include a third transistor first portion T3-1 and a third transistor second portion T3-2 that are adjacent and connected to each other.

The third transistor first portion T3-1 includes a channel region 131c1 that overlaps the first scan line 151 in a plan view, a first electrode 136c1 and a second electrode 137c1 that are disposed at respective sides of the channel region 131c1, and a gate electrode 155c1 that overlaps the channel region 131c1. The gate electrode 155c1 may correspond to a portion of a protrusion of the first scan line 151. The second electrode 137c1 is connected to the first connecting member 161a through a contact hole 62.

The third transistor second portion T3-2 includes a channel region 131c2 that overlaps the first scan line 151 in a plan view, a first electrode 136c2 and a second electrode 137c2 that are disposed at respective sides of the channel region 131c2, and a gate electrode 155c2 that overlaps the channel region 131c2. The gate electrode 155c2 may correspond to a portion of the first scan line 151. The first electrode 136c2 of the third transistor second portion T3-2 is connected to the second electrode 137a of the first transistor T1, and the second electrode 137c2 of the third transistor second portion T3-2 is connected to the first electrode 136c1 of the third transistor first portion T3-1.

The fourth transistor T4 may also be formed in two portions to prevent a leakage current. In the present embodiment, the fourth transistor T4 may include a fourth transistor first portion T4-1 and a fourth transistor second portion T4-2 that are adjacent and connected to each other. The fourth transistor first portion T4-1 and the fourth transistor second portion T4-2 may be disposed in a region through which the second scan line 152 passes as shown in an upper portion of FIG. 3.

The fourth transistor first portion T4-1 includes a channel region 131d1 that overlaps the second scan line 152 in a plan view, a first electrode 136d1 and a second electrode 137d1 that are disposed at respective sides of the channel region 131d1, and a gate electrode 155d1 that overlaps the channel region 131d1. The gate electrode 155d1 may correspond to a portion of the second scan line 152. As shown in FIG. 10, the first electrode 136d1 may be connected to the first initialization voltage line 127 through contact holes 67 and 68, and the second electrode 137d1 may be connected to the first electrode 136d2 of the fourth transistor second portion T4-2.

The fourth transistor second portion T4-2 includes a channel region 131d2 that overlaps the second scan line 152 in a plan view, a first electrode 136d2 and a second electrode 137d2 that are disposed at respective sides of the channel region 131d2, and a gate electrode 155d2 that overlaps the channel region 131d2. The gate electrode 155d2 may correspond to a portion of the second scan line 152.

The fifth transistor T5 includes a channel region 131e, a first electrode 136e and a second electrode 137e that are disposed at respective sides of the channel region 131e, and a gate electrode 155e that overlaps the channel region 131e. The gate electrode 155e may correspond to a portion of the control line 153. As shown in FIG. 10, the first electrode 136e is connected to the driving voltage line 172 through a contact hole 64, and the second electrode 137e is connected to the first electrode 136a of the first transistor T1. The first electrode 136e may be electrically connected to the driving voltage line 172 to receive the driving voltage ELVDD.

The sixth transistor T6 includes a channel region 131f, a first electrode 136f and a second electrode 137f that are disposed at respective sides of the channel region 131f, and a gate electrode 155f that overlaps the channel region 131f. The gate electrode 155f may correspond to a portion of the control line 153. The first electrode 136f is connected to the second electrode 137a of the first transistor T1, and, as shown in FIG. 10, the second electrode 137f is connected to the third connecting member 164 through a contact hole 65.

The seventh transistor T7 includes a channel region 131g, a first electrode 136g and a second electrode 137g that are disposed at respective sides of the channel region 131g, and a gate electrode 155g that overlaps the channel region 131g. The gate electrode 155g may correspond to a portion of the third scan line 154. The first electrode 136g is connected to the second electrode 137f of the sixth transistor T6, and, as shown in FIG. 10, the second electrode 137g is connected to the first initialization voltage line 127 through a contact hole 68 to receive the initialization voltage Vint.

The capacitor Cst may maintain a voltage of the driving gate electrode 155a. The capacitor Cst includes two terminals that correspond to the driving gate electrode 155a and the extension 157 of the storage line 156 that overlap each other in a plan view. The extension 157 of the storage line 156 may have a larger area in a plan view than that of the driving gate electrode 155a, and may cover an entire area of the driving gate electrode 155a.

Referring to FIG. 4 and FIG. 5, the display device may include a substrate 110. The substrate 110 may include an inorganic insulating material such as glass or an organic insulating material such as plastic such as polyimide (PI). The substrate 110 may have various degrees of flexibility.

A buffer layer 111 may be disposed on the substrate 110. The buffer layer 111 blocks impurities from permeating through the substrate 110 to an upper layer of the buffer layer 111, protecting the active layer 130, thereby preventing characteristic degradation of the active layer 130 while reducing stress. The buffer layer 111 may include an inorganic insulating material such as a silicon nitride or a silicon oxide, or an organic insulating material. A portion or all of the buffer layer 111 may be omitted.

The active layer 130 shown in FIG. 6 is disposed on the buffer layer 111, and a first insulating layer 141 is disposed on the active layer 130. The first insulating layer 141 may include an inorganic insulating material such as a silicon nitride or a silicon oxide, or an organic insulating material.

Referring to FIG. 7, the first conductive layer including the first, second, and third scan lines 151, 152, and 154, the control line 153, and the driving gate electrode 155a may be disposed on the first insulating layer 141.

A second insulating layer 142 is disposed on the first conductive layer and the first insulating layer 141. The second insulating layer 142 may include an inorganic insulating material such as a silicon nitride or a silicon oxide, or an organic insulating material.

Referring to FIG. 8, the second conductive layer including the storage line 156, the extension 157, and the first initialization voltage line 127 may be disposed on the second insulating layer 142. The extension 157 of the storage line 156 may overlap the driving gate electrode 155a of the first transistor T1 with the second insulating layer 142 interposed therebetween to form the capacitor Cst. The first initialization voltage line 127 may be connected to the second initialization voltage line 128 to transmit the initialization voltage Vint.

A third insulating layer 161 may be disposed on the second conductive layer and the second insulating layer 142. The third insulating layer 161 may include an inorganic insulating material such as a silicon nitride or a silicon oxide, or an organic insulating material.

Referring to FIG. 9, the third conductive layer including the first connecting member 161a, the second connecting member 162, the third connecting member 164, the fourth connecting members 167 and 168, and the driving voltage line 172 may be disposed on the third insulating layer 161. The driving voltage line 172 may extend substantially in the second direction in a plan view crossing the first, second, and third scan lines 151, 152, and 154, the control line 153, the first initialization voltage line 127, and the storage line 156 and may transmit the driving voltage ELVDD.

The first connecting member 161a is electrically connected to the driving gate electrode 155a of the first transistor T1, the second electrode 137c2 of the third transistor first portion T3-1, and the second electrode 137d2 of the fourth transistor first portion T4-1 through the contact holes 61 and 62. The second connecting member 162 is electrically connected to the first electrode 136b of the second transistor T2 through the contact hole 63. The third connecting member 164 may be electrically connected to the second electrode 137f of the sixth transistor T6 through the contact hole 64.

The fourth connecting members 167 and 168 are electrically connected to the first initialization voltage line 127 through the contact hole 67, and electrically connected to the first electrode 136d1 of the fourth transistor T4 through the contact hole 68. The fourth connecting members 167 and 168 transmit the initialization voltage Vint to the fourth transistor T4.

In some embodiments, shapes of the fourth connecting members 167 and 168 may be varied depending on their connectivity to the second initialization voltage line. As shown in FIG. 10, the fourth connecting member 167 is connected to the second initialization voltage line 128 and may include a connection extension 167a, and the fourth connecting member 168 is not connected to the second initialization voltage line and may not include an extension. The connection extension 167a may have various shapes to be connected to the second initialization voltage line 128. For example, the connection extension 167a may have a shape protruding toward the second initialization voltage line 128.

The driving voltage line 172 may be electrically connected to the first electrode 136e of the fifth transistor T5 through the contact hole 64, and may be electrically connected to the extension 157 of the storage line 156 through a contact hole 69. The extension 157 may be connected to the driving voltage line 172 through the contact hole 69 to receive the driving voltage ELVDD.

The fourth insulating layer 162 may be disposed on the third conductive layer and the third insulating layer 161. The fourth insulating layer 162 may include an inorganic insulating material such as a silicon nitride and a silicon oxide, and/or an organic insulating material.

Referring to FIG. 10, the fourth conductive layer including the data lines 171 and the second initialization voltage line 128 and the extension 129 may be disposed on the fourth insulating layer 162. The data line 171 is electrically connected to the second connecting member 162 through the contact hole 71.

The second initialization voltage line 128 may extend along the second direction DR2 along with the driving voltage line 172. The second initialization voltage line 128 may have a shape to overlap the driving voltage line 172. For example, the driving voltage line 172 is bent in a zigzag shape while extending along the second direction DR2, and the second initialization voltage line 128 may also be bent to correspond to the shape of the driving voltage line 172.

The second initialization voltage line 128 may receive the initialization voltage Vint, and the driving voltage line 172 may receive the driving voltage ELVDD. Each of the second initialization voltage line 128 and the driving voltage line 172 may receive a constant voltage to prevent a signal delay issue that may occur due to overlapping of the signal lines.

The extension 129 may extend from the second initialization voltage line 128 along the first direction DR1. The expansion 129 may be electrically connected to the fourth connecting member 167 through the contact hole 78. Particularly, the fourth connecting member 167 may include the connection extension 167a, and the contact hole 78 may overlap the connection extension 167a. The connection extension 167a and the extension 129 of the second initialization voltage line 128 may be electrically connected to each other through the contact hole 78.

The second initialization voltage line 128 may be disposed for every n pixels PX disposed along the first direction DR1. FIG. 3 shows an embodiment in which the second initialization voltage line 128 is disposed for every two pixels PX. As shown in FIG. 10, the pixel PX that includes the second initialization voltage line 128 may be referred to as a first pixel PX1, and the pixel PX that does not include the second initialization voltage line 128 may be referred to as a second pixel PX2.

The first pixel PX1 may include the second initialization voltage line 128, and the second initialization voltage line 128 may be electrically connected to the first initialization voltage line 127. The first initialization voltage line 127 and the second initialization voltage line 128 may be connected to each other through the fourth connecting member 167. The fourth connecting member 167 included in the first pixel PX1 may include the connection extension 167a that is electrically connected to the second initialization voltage line 128. As shown in FIG. 4, the fourth insulating layer 162 included in the first pixel PX1 may include the contact hole 78.

On the other hand, the second pixel PX2 may include the first initialization voltage line 127 extending in the first direction DR1 but may not include the second initialization voltage line. The first initialization voltage line 127 may be connected to the active layer 130 through the fourth connecting member 168. The fourth connecting member 168 may not include an extension that is connected to a separate second initialization voltage line. The fourth insulating layer 162 overlapping the second pixel PX2 may neither include a separate contact hole for exposing the connecting member 168.

Based on a cross-sectional view, the first initialization voltage line 127, the driving voltage line 172, and the second initialization voltage line 128 may be disposed in different layers. For example, the first initialization voltage line 127, the driving voltage line 172, and the second initialization voltage line 128 may be sequentially disposed in different layers. Specifically, the first initialization voltage line 127 may be disposed on the second conductive layer, the driving voltage line 172 may be disposed on the third conductive layer, and the second initialization voltage line 128 may be disposed on the fourth conductive layer, but the present disclosure is not limited thereto, and the arrangement of the first initialization voltage line 127, the driving voltage line 172, and the second initialization voltage line 128 may be varied depending on the layout of the pixel PX without deviating from the scope of the present disclosure.

A fifth insulating layer 180 is disposed on the fourth conductive layer that includes the data line 171, the second initialization voltage line 128, and the extension 129, and the fourth insulating layer 162. The fifth insulating layer 180 may include an organic insulating material such as a poly-acryl-based resin or a polyimide-based resin. An upper surface of the fifth insulating layer 180 may be substantially flat.

Referring to FIG. 3, FIG. 4, and FIG. 5, a fifth conductive layer that includes a plurality of pixel electrodes 191b and 191c (including 191a of FIG. 1 that is not shown) may be disposed on the fifth insulating layer 180. The pixel electrodes 191b and 191c may be connected to the third connecting member 164 through a contact hole 89. A partition wall 350 may be disposed on the fifth insulating layer 180 and the pixel electrodes 191b and 191c. The partition wall 350 may have an opening disposed on each of the pixel electrodes 191b and 191c. An emission layer 370 is disposed on the pixel electrodes 191b and 191c. The emission layer 370 may be disposed in the opening of the partition wall 350. The emission layer 370 may include an organic light emitting material or an inorganic light emitting material. A common electrode 270 is disposed on the emission layer 370. The common electrode 270 is also disposed on the partition wall 350, and may be extended over a plurality of pixels PX. The pixel electrode 191b and 191c, the emission layer 370, and the common electrode 270 may form a light emitting diode (LED). A sealing layer (not shown) protecting the light emitting diode (LED) may be disposed on the common electrode 270. The sealing layer may include an inorganic layer and an organic layer that are alternately stacked, only an inorganic layer, or only an organic layer.

Figure 11:
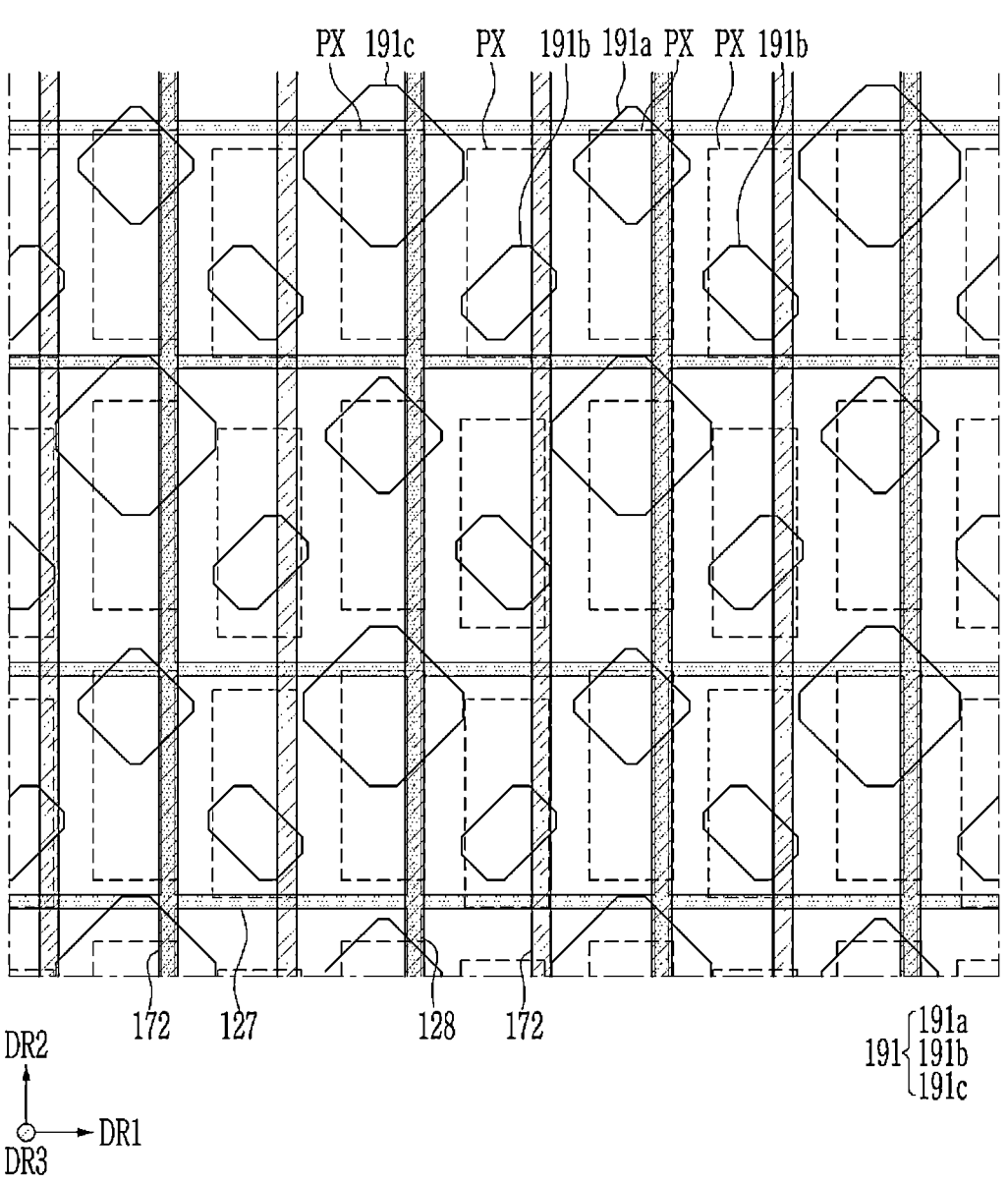
FIG. 11, FIG. 12, and FIG. 13 respectively illustrate a schematic top plan view of an area of a portion of a display device according to an embodiment.
Figure 12:
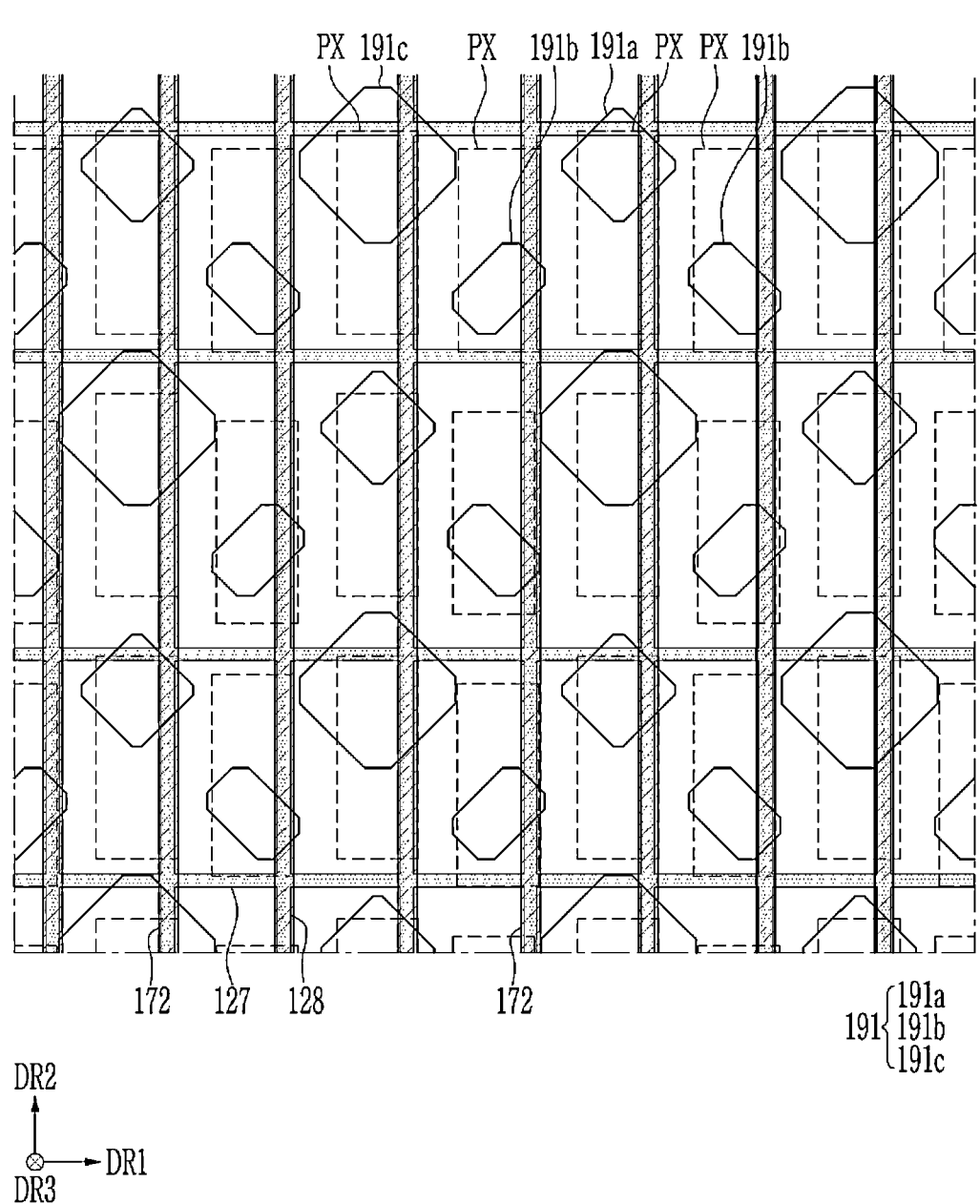
Figure 13:
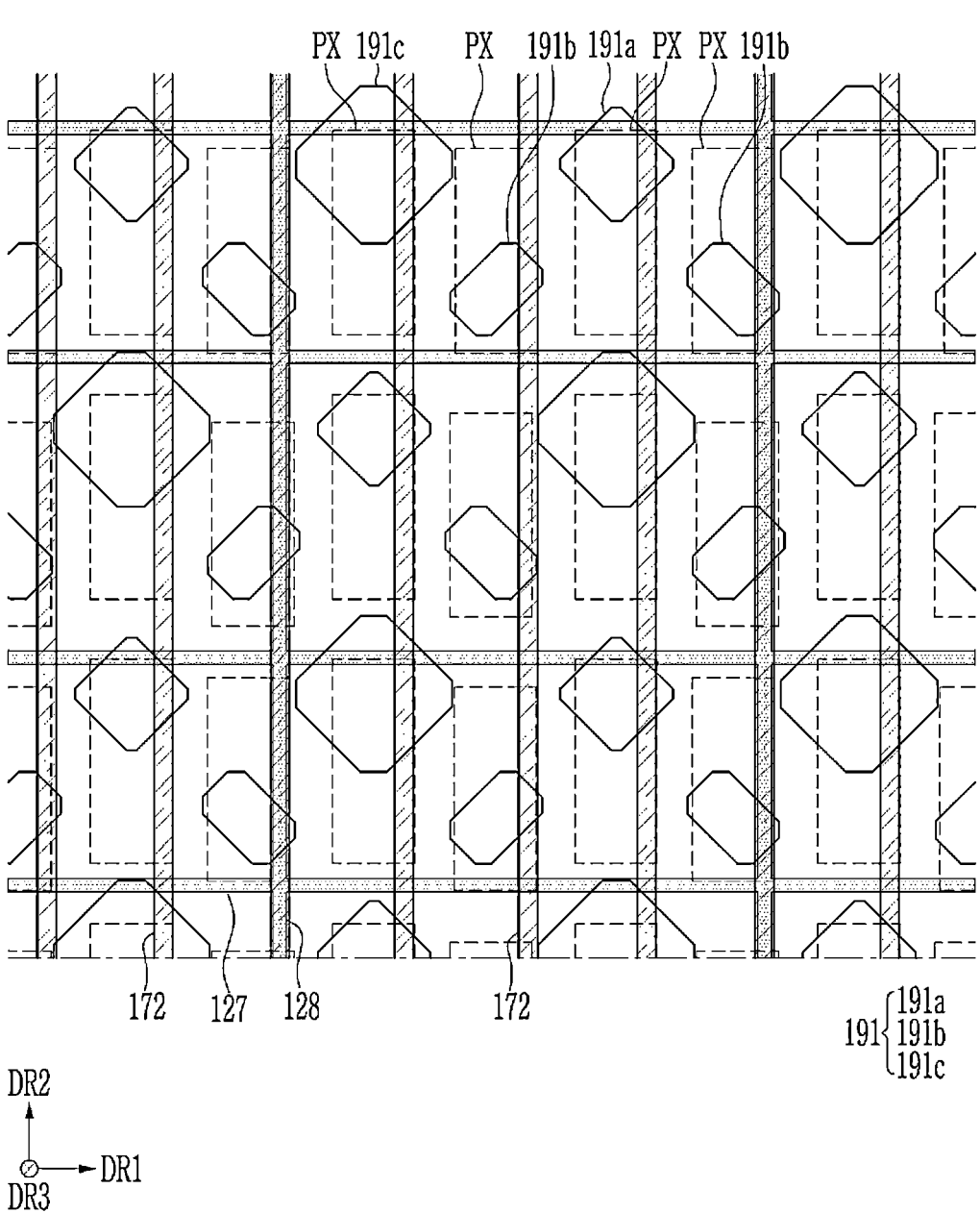

FIG. 11, FIG. 12, and FIG. 13 respectively illustrate a schematic top plan view of an area of a portion of the display device according to an embodiment. Description of the constituent element described above will be omitted.

Referring to FIG. 11, the first initialization voltage line 127 may extend along the first direction DR1, and the second initialization voltage line 128 may extend along the second direction DR2 crossing the first direction DR1. The first initialization voltage line 127 and the second initialization voltage line 128 may have a mesh structure in a plan view.

The first initialization voltage line 127 and the second initialization voltage line 128 may be disposed in different layers or in the same layer. In a case where the first initialization voltage line 127 and the second initialization voltage line 128 are disposed in different layers, they may be connected to each other through a contact hole. The first initialization voltage line 127 and the second initialization voltage line 128 may receive the same voltage, for example, the initialization voltage Vint.

According to an embodiment, the second initialization voltage line 128 may overlap the driving voltage line 172.

The second initialization voltage line 128 and the driving voltage line 172 extending along the second direction DR2 and overlapping each other may increase the aperture ratio of the pixel PX.

The second initialization voltage line 128 may be disposed for every n pixels PX among the plurality of pixels PX disposed in the first direction DR1. Here, n is a natural number of 1 or greater. FIG. 11 shows an embodiment in which the second initialization voltage line 128 is disposed for every two pixels PX that are adjacent along the first direction DR1. Since the second initialization voltage line 128 is disposed for every two pixels PX, the second initialization voltage line 128 may overlap every two driving voltage lines 172.

In the display device according to an embodiment, R/G/ B/G pixels or B/G/R/G pixels may be alternately disposed along the first direction DR1. The second initialization voltage line 128 disposed for every two pixels PX may repeatedly overlap a first pixel displaying a first color and a third pixel displaying a third color. In some embodiments, the second initialization voltage line 128 may alternately overlap the third pixel displaying the third color and the first pixel displaying the first color along the first direction DR1, and may overlap the third pixel displaying the third color and the first pixel displaying the first color along the second direction DR2, but the present disclosure is not limited thereto.

Referring to FIG. 12, the second initialization voltage line 128 may be disposed for every n pixels PX in the plurality of pixels PX disposed in the first direction DR1. Here, n is a natural number of 1 or greater. FIG. 12 shows an embodiment in which the second initialization voltage line 128 is disposed for each pixel PX adjacent along the first direction DR1. Since the second initialization voltage line 128 is disposed for each pixel PX, the second initialization voltage line 128 may overlap each of the driving voltage lines 172.

In the display device according to an embodiment, R/G/ B/G pixels may be alternately disposed or B/G/R/G pixels may be alternately disposed along the first direction DR1. The second initialization voltage line 128 disposed for each pixel PX may overlap the first pixel displaying the first color, the second pixel displaying the second color, and the third pixel displaying the third color.

Referring to FIG. 13, the second initialization voltage line 128 may be disposed for every n pixels PX in the plurality of pixels PX disposed in the first direction DR1. Here, n is a natural number of 1 or greater. FIG. 13 shows an embodiment in which the second initialization voltage line 128 is disposed for every four pixels PX that are adjacent to each other along the first direction DR1. Since the second initialization voltage line 128 is disposed for every four pixels PX, the second initialization voltage line 128 may overlap every four driving voltage lines 172.

In the display device according to an embodiment, R/G/ B/G pixels may be alternately disposed or B/G/R/G pixels may be alternately disposed along the first direction DR1. The second initialization voltage line 128 disposed for every four pixels PX may repeatedly overlap the second pixel displaying the second color along the first direction DR1 and the second direction DR2. However, the present disclosure is not limited thereto, and second initialization voltage line 128 may overlap the first pixel displaying the first color or the third pixel displaying the third color according to arrangement of the second initialization voltage line 128.

According to the above-described embodiments, as the initialization voltage line (e.g., the first initialization voltage line 127, the second initialization voltage line 128) and the driving voltage line 172 overlap each other while extending in the same direction, the aperture ratio of the pixel PX may be improved. In addition, the initialization voltage line provided in a mesh form may improve the display quality of the display device.

While the present disclosure has been described in connection with some embodiments, it is to be understood that the present disclosure is not limited to the disclosed embodiments, but, on the contrary, is intended to cover various modifications and equivalent arrangements included within the spirit and scope of the present disclosure including the appended claims.

What is claimed is:

1. A display device comprising:
   a substrate;
   a plurality of pixels disposed on the substrate, the plurality of pixels comprising first color pixels, second color pixels, and third color pixels;
   a first initialization voltage line extending in a first direction; and
   a second initialization voltage line extending in a second direction that crosses the first direction, the second initialization voltage line being electrically connected to the first initialization voltage line,
   wherein
   the first initialization voltage line and the second initialization voltage line are disposed on different layers,
   the first initialization voltage line comprises a branch portion protruding in the second direction,
   the first initialization voltage line and the second initialization voltage line contact each other in a region overlapping the branch portion,
   the first initialization voltage line is arranged periodically corresponding to two or more of the plurality of pixels along the second direction, and
   the first initialization voltage line partially overlaps at least one of the plurality of pixels.

2. The display device of claim 1, wherein
   the first color pixel, the second color pixel, the first color pixel, and the third color pixel are arranged along the second direction to form a unit, and
   the first initialization voltage line is disposed for every four of the first color pixels arranged along the second direction.

3. The display device of claim 1, wherein the first initialization voltage line overlaps the first color pixel.

4. The display device of claim 1, wherein the first color pixel is configured to emit green light.

5. The display device of claim 1, wherein the first initialization voltage line is disposed in a data conductive layer, and the second initialization voltage line is disposed in a gate conductive layer.

6. The display device of claim 5, wherein the first initialization voltage line is disposed above the second initialization voltage line.

7. The display device of claim 1, further comprising a driving voltage line extending in the first direction,
   wherein at least a portion of the first initialization voltage line and the driving voltage line overlap each other.

8. The display device of claim 7, wherein the second initialization voltage line, the driving voltage line, and the first initialization voltage line are sequentially stacked on the substrate in different layers.

9. The display device of claim 1, wherein the first direction is a vertical direction, and the second direction is a horizontal direction.

10. The display device of claim 9, wherein the first initialization voltage line is a vertical initialization voltage line, and the second initialization voltage line is a horizontal initialization voltage line.

11. The display device of claim 1, wherein the first and second initialization voltage lines are configured to supply a same initialization voltage.

12. The display device of claim 1, wherein the plurality of pixels comprises first pixels over which the first initialization voltage line is disposed, and second pixels over which the first initialization voltage line is not disposed.

13. The display device of claim 3, wherein the second color pixel is a blue pixel, and the third color pixel is a red pixel.

14. An electronic device, comprising:

a processor; and a display device operably connected to the processor, the display device comprising:

a substrate;

a plurality of pixels disposed on the substrate, the plurality of pixels comprising first color pixels, second color pixels, and third color pixels;

a first initialization voltage line extending in a first direction; and a second initialization voltage line extending in a second direction that crosses the first direction, the second initialization voltage line being electrically connected to the first initialization voltage line, wherein the first initialization voltage line and the second initialization voltage line are disposed on different layers, the first initialization voltage line comprises a branch portion protruding in the second direction, the first initialization voltage line and the second initialization voltage line contact each other in a region overlapping the branch portion, the first initialization voltage line is arranged periodically corresponding to two or more of the plurality of pixels along the second direction, and the first initialization voltage line partially overlaps at least one of the plurality of pixels.

15. The electronic device of claim 14, wherein in the display device, the first color pixel, the second color pixel, the first color pixel, and the third color pixel arranged along the second direction form a unit, and the first initialization voltage line is disposed for every four of the first color pixels arranged along the second direction.

16. The electronic device of claim 15, wherein the first color pixel is configured to emit green light.

17. The electronic device of claim 14, wherein in the display device, the first initialization voltage line is disposed in a data conductive layer, and the second initialization voltage line is disposed in a gate conductive layer.

18. The electronic device of claim 14, wherein the display device further comprises a driving voltage line extending in the first direction, and at least a portion of the first initialization voltage line and the driving voltage line overlap each other.

19. The electronic device of claim 18, wherein in the display device, the second initialization voltage line, the driving voltage line, and the first initialization voltage line are sequentially stacked on the substrate in different layers.

20. The electronic device of claim 14, wherein in the display device, the first direction is a vertical direction, and the second direction is a horizontal direction.

\* \* \* \* \*